(12) United States Patent
Loong et al.

(10) Patent No.: US 9,655,294 B2
(45) Date of Patent: May 16, 2017

(54) METHOD OF PRODUCING ELECTRONICS SUBSTRATE WITH ENHANCED DIRECT BONDED METAL

(71) Applicant: Wolverine Tube, Inc., Decatur, AL (US)

(72) Inventors: Sy-Jenq Loong, Madison, AL (US); Donald Lynn Smith, Danville, AL (US)

(73) Assignee: Wolverine Tube, Inc., Decatur, AL (US)

( * ) Notice: Subject to any disclaimer, the term of this patent is extended or adjusted under 35 U.S.C. 154(b) by 0 days.

(21) Appl. No.: 14/307,074

(22) Filed: Jun. 17, 2014

(65) Prior Publication Data

US 2014/0290042 A1    Oct. 2, 2014

Related U.S. Application Data

(63) Continuation of application No. 13/191,281, filed on Jul. 26, 2011, now abandoned.

(Continued)

(51) Int. Cl.
*B23P 13/04*    (2006.01)
*H05K 13/00*    (2006.01)
(Continued)

(52) U.S. Cl.
CPC ..... *H05K 13/0023* (2013.01); *H01L 21/4878* (2013.01); *H01L 23/473* (2013.01);
(Continued)

(58) Field of Classification Search
CPC ......... H01L 2225/06589; H01L 23/367; H01L 21/4882; Y10T 156/10; Y10T 29/49826;
(Continued)

(56) References Cited

U.S. PATENT DOCUMENTS 3,979,042 A    9/1976 Peters
5,021,924 A    6/1991 Kieda et al.
(Continued)

FOREIGN PATENT DOCUMENTS

CN    2696126    4/2005
CN    201623026    11/2010
(Continued)

OTHER PUBLICATIONS

"DBC (Direct Bond Copper) Substrate and DPC (Direct Plated Copper) Substrate," Mar. 16, 2009, 9 pages.
(Continued)

*Primary Examiner* — Thiem Phan
(74) *Attorney, Agent, or Firm* — Angela Holt; Bradley Arant Boult Cummings LLP

(57) ABSTRACT

A substrate for electronic components is formed by bonding a cooling metal layer to one side of a ceramic tile and bonding an electronic metal layer to the other side of the electronic tile. The substrate is secured to a machining base and the cooling metal layer surface is enhanced through an MDT process. In the process, fins are sliced into the cooling metal layer with a tool to a depth of less than the cooling metal layer thickness. The slicing forces material upward without removing material from the cooling metal layer, forming fins that extend beyond the original thickness of the cooling metal layer. The fins can be cross-sliced at an angle to form pins.

8 Claims, 5 Drawing Sheets

Related U.S. Application Data

(60) Provisional application No. 61/368,475, filed on Jul. 28, 2010.

(51) Int. Cl.
  *H01L 21/48* (2006.01)
  *H01L 23/473* (2006.01)
  *H05K 7/20* (2006.01)
  *H05K 1/03* (2006.01)
  *H05K 3/00* (2006.01)

(52) U.S. Cl.
  CPC .. *H05K 7/20254* (2013.01); *H01L 2924/0002* (2013.01); *H05K 1/0306* (2013.01); *H05K 3/0061* (2013.01); *Y10T 29/49002* (2015.01); *Y10T 29/49124* (2015.01); *Y10T 83/0341* (2015.04)

(58) Field of Classification Search
  CPC ............. Y10T 29/4935; Y10T 29/4913; Y10T 29/49359; F21V 29/20; F28F 2215/00; G02B 6/3814; F28D 15/00; F28D 2021/0029
  USPC ... 361/679.54, 699, 701, 702, 709–711, 688, 361/689, 704, 706, 707; 174/252, 548; 29/854, 557, 832, 840, 890.03, 890.046, 29/890.049, 890.05; 407/113, 114
  See application file for complete search history.

(56) References Cited

U.S. PATENT DOCUMENTS

| | | | |
|---|---|---|---|
| 5,183,104 A | 2/1993 | Novotny | |
| 5,270,572 A | 12/1993 | Nakajima et al. | |
| 5,453,911 A | 9/1995 | Wolgemuth et al. | |
| 5,563,447 A | 10/1996 | Lake et al. | |
| 5,775,187 A * | 7/1998 | Nikolai | B21C 37/207 407/113 |
| 5,796,049 A | 8/1998 | Schneider | |
| 5,801,442 A | 9/1998 | Hamilton et al. | |
| 5,818,692 A | 10/1998 | Denney, Jr. et al. | |
| 5,998,240 A | 12/1999 | Hamilton et al. | |
| 6,020,637 A | 2/2000 | Karnezos | |
| 6,233,149 B1 | 5/2001 | Bailey et al. | |
| 6,250,127 B1 | 6/2001 | Polese et al. | |
| 6,284,389 B1 | 9/2001 | Jones et al. | |
| 6,400,012 B1 | 6/2002 | Miller et al. | |
| 6,457,514 B1 | 10/2002 | Fumi | |
| 6,594,149 B2 | 7/2003 | Yamada et al. | |
| 6,644,395 B1 | 11/2003 | Bergin | |
| 6,912,130 B2 * | 6/2005 | Osanai | H01L 23/3735 165/104.33 |
| 6,986,382 B2 | 1/2006 | Upadhya et al. | |
| 6,988,534 B2 | 1/2006 | Kenny et al. | |
| 6,989,991 B2 | 1/2006 | Barson et al. | |
| 7,017,654 B2 | 3/2006 | Kenny et al. | |
| 7,104,312 B2 | 9/2006 | Goodson et al. | |
| 7,188,662 B2 | 3/2007 | Brewer et al. | |
| 7,190,581 B1 | 3/2007 | Hassani et al. | |
| 7,215,545 B1 * | 5/2007 | Moghaddam | H01L 23/3732 165/185 |
| 7,277,284 B2 | 10/2007 | Lee et al. | |
| 7,464,747 B2 | 12/2008 | Nakahama et al. | |
| 7,557,438 B2 | 7/2009 | Chrysler et al. | |
| 7,564,129 B2 | 7/2009 | Nakanishi et al. | |
| 7,709,099 B2 | 5/2010 | Yokoyama | |
| 7,749,430 B2 | 7/2010 | Fukui | |
| 7,755,185 B2 | 7/2010 | Bayerer et al. | |
| 7,836,597 B2 | 11/2010 | Datta et al. | |
| 7,859,103 B2 | 12/2010 | Aoki et al. | |
| 7,884,468 B2 | 2/2011 | Mann et al. | |
| 8,081,465 B2 | 12/2011 | Nishiura | |
| 2002/0006526 A1 | 1/2002 | Polese et al. | |
| 2002/0036881 A1 | 3/2002 | Shamouilian et al. | |
| 2004/0062009 A1 | 4/2004 | Osanai et al. | |
| 2006/0291165 A1 | 12/2006 | Flesch et al. | |
| 2007/0222042 A1 | 9/2007 | Lee et al. | |
| 2008/0291640 A1 | 11/2008 | Chen et al. | |
| 2010/0127383 A1 | 5/2010 | Oka et al. | |
| 2010/0147492 A1 | 6/2010 | Conry | |
| 2010/0206537 A1 | 8/2010 | Ikeda et al. | |
| 2010/0314072 A1 | 12/2010 | Lee et al. | |
| 2010/0326750 A1 | 12/2010 | Murakami | |
| 2012/0320529 A1 | 12/2012 | Loong et al. | |

FOREIGN PATENT DOCUMENTS

| | | |
|---|---|---|
| DE | 19960840 | 7/2001 |
| DE | 102006019376 | 10/2007 |
| JP | 11-097587 | 4/1999 |
| JP | 2007012722 | 1/2007 |
| JP | 2008098493 | 4/2008 |
| JP | 2008205383 | 9/2008 |
| JP | 2009054731 | 3/2009 |
| KR | 10-2009-0062139 | 6/2009 |
| WO | 2010020438 | 2/2010 |

OTHER PUBLICATIONS

Kris Vasoya; EVP Engineering, Thermal Works L.P.; "Reducing Hot Spots and Junction Temperatures of Integrated Circuits Using Carbon Composite in a Printed Circuit Board and Substrate," 22nd IEEE Semi-Therm Symposium, 2006, pp. 237-239.

Tien-Yu (Tom) Lee; "Design Optimization of an Integrated Liquid-Cooled IGBT Power Module Using CFD Technique," IEEE Transactions on Components and Packaging Technologies, vol. 23, No. 1, Mar. 2000, pp. 55-60.

Charlotte Gillot et al., "Integrated Single and Two-Phase Micro Heat Sinks Under IGBT Chips," IEEE Transactions on Components and Packaging Technology, vol. 22, No. 3, Sep. 1999, pp. 384-389.

International Search Report and Written Opinion mailed Apr. 6, 2012 in corresponding International Application No. PCT/US2011/045623 filed on Jul. 27, 2011.

International Search Report and Written Opinion mailed Feb. 20, 2013 in related International Application No. PCT/US2012/053451 filed Aug. 31, 2012.

* cited by examiner

METHOD OF PRODUCING ELECTRONICS SUBSTRATE WITH ENHANCED DIRECT BONDED METAL

REFERENCE TO RELATED APPLICATIONS

The present application is a continuation of U.S. application Ser. No. 13/191,281 filed on Jul. 26, 2011 which claims the benefit of U.S. Provisional Patent Application 61/368,475, filed Jul. 28, 2010. The entire contents of U.S. application Ser. No. 13/191,281 filed on Jul. 26, 2011 are herein incorporated by reference.

BACKGROUND OF THE INVENTION

Field of the Invention

This invention relates to electronic substrates with direct bonded or direct plated metals, where the surface of the direct bonded or direct plated metal is enhanced for heat transfer purposes.

Description of the Related Art

Certain electronic devices generate heat as they operate, and in some cases this heat has to be removed or dissipated for the device to continue operating properly. Several techniques have been used to cool electronic equipment. Examples include fans, which are used to blow air over electronic equipment. This air serves to convectively cool the electronic equipment with normal ambient air. Other techniques that have been used include liquid cold plates. Liquid cold plates are plates with channels through which liquid flows. The electronic equipment is mounted in contact with a liquid cold plate and the heat generated by the electronic equipment is transferred to the liquid coolant inside the plate. This can provide better cooling than the convective cooling provided by a fan with considerably less flow volume. It can also provide better temperature consistency with less acoustic noise.

Cold plates can be directly affixed to a heat-producing piece of electronic equipment, such as an electronic chip or an insulated gated bipolar transistor (IGBT). It is also possible to use thermal grease or other heat transfer aid between the electronic equipment and the cold plate to improve heat transfer. Typically, the cold plate includes an inlet and an outlet for liquid coolant flow. The liquid coolant absorbs the heat produced by the electronic equipment, and transfers the absorbed heat to the coolant which then flows out of the cold plate. Many cold plates provide cooling with a relatively low flow of liquid coolant. They can provide better temperature consistency than convective cooling, minimal acoustic noise and the cooling power of liquid coolants.

Several factors impact the performance and desirability of cold plates, and different factors are important for different uses. Some important factors include cost of production and ease of producing relatively large quantities. Cooling efficiency should be high, and cold plates should be securely sealed to prevent any leak of liquid coolant onto the electronic equipment being cooled.

In some applications, the coolant may not be particularly clean, which can result in plugging of the cold plate. For example, a cold plate used in an automobile may utilize the anti-freeze liquid for cooling, and the anti-freeze can contain small particulates. In other applications, there may be a phase transfer within a cold plate to help facilitate cooling. It is also possible for a cold plate to be used for heating a component by replacing the coolant with a heating fluid. One primary difference between a coolant and a heating fluid in one phase heat transfer is that the temperature of a coolant is lower than the item being cooled, and the temperature of a heating fluid is higher than the item being cooled.

Many different techniques are used to cool electronic components, and new techniques which provide cooling benefits are desirable.

BRIEF SUMMARY OF THE INVENTION

A substrate for electronic components includes a ceramic tile and a cooling metal layer. The cooling metal layer can include copper, aluminum, nickel, gold, or other metals. The cooling metal layer has an enhanced surface facing away from the ceramic tile, where the enhanced surface includes either fins or pins. Electronic components can be connected to the substrate on a surface opposite the cooling metal layer.

DETAILED DESCRIPTION

Heat Transfer Fundamentals

Figure 1:
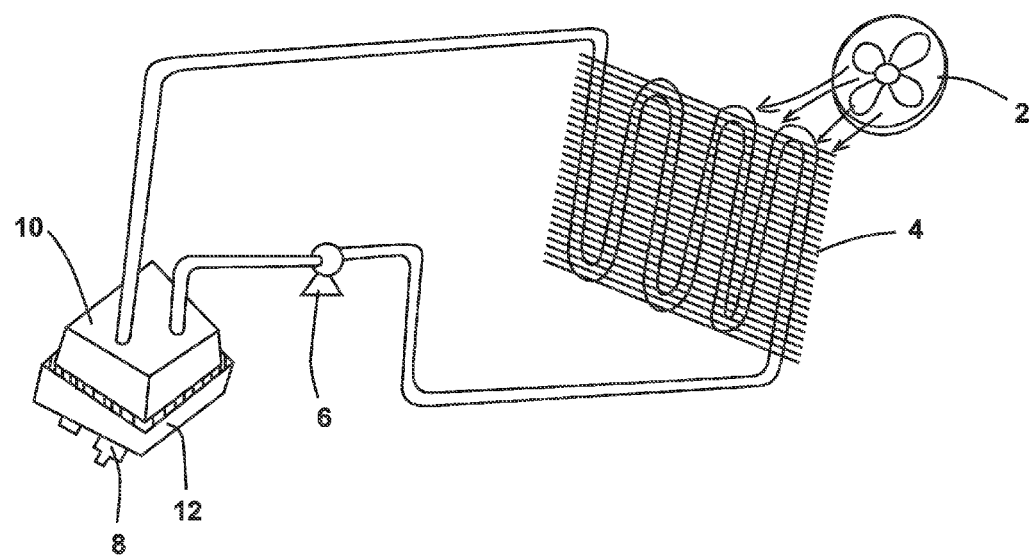
FIG. 1 shows a schematic diagram of one embodiment of a cooling system.

There are several ways to cool electronic equipment. Often times, electronic equipment is cooled with fans which blow air over the electronic equipment. This air provides convective cooling which does help to control the heat generated by the electronic equipment. However, liquid cooling can provide greater cooling capacity than air flow in many situations.

Liquids can provide better cooling than gases for several reasons. For example, liquids are denser than gases so more thermal mass is available to absorb heat from the electronic equipment. Also, liquids generally have higher thermal conductivities so heat will transfer into and through the liquid more rapidly than heat will transfer into and through a gas. Furthermore, liquids tend to have a higher specific heat than gases so a set quantity of liquid will absorb and transfer more heat than a comparable amount of gas. Because of this, when electronic equipment is utilized which produces large amounts of heat, many manufacturers desire the use of liquid cooling devices.

Liquid cooling systems include at least a liquid coolant and an article or substance that is cooled. Often, there is a barrier between the liquid coolant and the item being cooled, and heat must be transferred through this barrier. In some instances, the barrier can include multiple components and layers. A barrier between the item being cooled and the liquid coolant is generally desired for electronic equipment, because direct contact with liquids can damage some electronic components. Minimizing the resistance to heat flow through the barrier between the item being cooled and the liquid coolant improves the cooling efficiency.

Two significant forms of resistance to heat flow through a barrier include resistance through one material, and resistance across an interface between two separate components or parts. Resistance to heat flow through a single material is minimized if the material is a heat conductor, instead of a heat insulator. Copper is one material that can be used in a barrier, because it is a good conductor of heat and it is relatively malleable. However, other materials can also be used, including aluminum, steel and other metals, graphite, ceramics, and even insulating materials like plastic or air.

Another source of resistance to heat flow is at the interface between two components or parts. Typically, when heat flows from a first component to another component which contacts the first, there is a resistance to heat flow between the two components. Reducing the number of interfaces can improve heat transfer rates. Also, when two materials form an interface, there can be air trapped between the two materials, and air is an insulator that tends to hinder heat transfer. Thermal grease can be used to facilitate heat transfer between two different components or layers in a barrier, but a single heat transfer layer is typically more efficient than two separate layers even when thermal grease or other heat transfer agents are used.

It is also desirable to maximize the surface area where the cooling liquid contacts the barrier because the larger the surface area, the more area available to transfer heat. The use of fins, pins, or other structures on a surface contacting the liquid coolant can increase the surface area and improve heat transfer. Surface area can be further increased by increasing the number of fins, pins, or other structures, or by increasing the surface area of each fin, pin, or structure. A surface with fins, pins, or other structures to improve heat transfer is said to be "enhanced," so the fins, pins, or other structures can be generically referred to as enhancements.

Forming enhancements directly from a heat transfer surface, instead of attaching the enhancements to the heat transfer surface, can improve heat transfer because this eliminates the interface between the base of the heat transfer surface and the enhancement. Therefore, by forming fins or other enhancements from the material of the heat transfer surface, resistance to heat flow is minimized. If one were to produce the enhancements separately and then affix them to the heat transfer surface, there would be a resistance to heat flow between the enhancements and the heat transfer surface at the interface, which would have a negative impact on the heat transfer rate. This is true even if separate enhancements and the heat transfer surface were made from the same material, such as copper. Therefore, it is preferred to form the enhancements directly from the material of the heat transfer surface such that the enhancements are an extension of the heat transfer surface, and there is no interface between the enhancements and heat transfer surface. This is referred to as having the enhancements "monolithic" with the heat transfer surface.

In some cases, liquids will flow across a solid in what is referred to as laminar flow. In laminar flow, the layer of liquid directly contacting the solid surface remains essentially stationary at the solid surface. The layer of liquid directly above that layer moves very gradually across the first layer. The next layer up moves a little more swiftly, etc., such that the highest flow rate will be at a point relatively far from the solid surface. The lowest flow rate, which is essentially zero, will be at the solid surface. Each different layer of liquid which is sliding over the adjacent layers provides its own resistance to heat flow, and each layer can have a different temperature so the warmest liquid is often adjacent the solid surface and the coolest liquid is relatively far from the solid surface. Therefore, if the liquid can be mixed during flow, the liquid directly contacting the solid surface can absorb heat from the solid surface and then be mixed with the entire body of cooling liquid to spread the absorbed heat into the liquid more rapidly.

Turbulent flow causes liquids to mix as they flow across a solid surface, as opposed to laminar flow. This tends to keep the liquid in contact with the solid surface cooler, which facilitates a faster transfer of heat from the solid surface to the liquid. Some things which tend to increase turbulent flow include faster flow rates, uneven surfaces, projections into a flowing liquid, and various obstructions that force a liquid to change path and flow another way. To maximize turbulence, one can include sharp bends, twisting edges, pins, fins, and any of a wide variety of flow obstructions that cause rapid change in the direction of flow of a liquid. Many structures which increase turbulence can also increase pressure drop across a cold plate. Increased pressure drop can lower the flow rate, so a balance must be observed to ensure efficient heat transfer. Obstructions which tend to increase the amount of fluid flow close to the solid surface also tends to increase heat transfer, because this reduces the thickness of any stagnant liquid layer at the solid liquid interface, and it also reduces the distance heated liquid has to travel to intermix with the main body of cooling liquid.

In some embodiments, the liquid can be boiled, or vaporized, in the heat transfer process. This is referred to as two phase cooling because the coolant changes phase from a liquid to a gas in the cooling process. A liquid absorbs heat to vaporize, so the heat of vaporization of the liquid is absorbed, and this can increase the overall cooling effect. This description explains one phase cooling only, but it is to be understood that two phase cooling could also be used and is included as an embodiment of this description. Two phase cooling can require some additional components, such as a condenser to re-liquefy the coolant from a gas, as is understood by those skilled in the art. The principles discussed in this description also apply to two phase cooling.

In many electronic cooling systems, the coolant is recirculated and used repeatedly. In the embodiment shown in FIG. 1, a fan 2 is used to blow cooling air through a convective cooling device 4, and the coolant is pumped through the convective cooling device 4 by a pump 6. The coolant exiting the convective cooling device 4 is relatively cool, and is pumped through a heat transfer device 10 which is connected to an electronic component 8. The coolant is heated as the electronic component 8 is cooled, and the heated coolant is then pumped back to the convective cooling device 4 to be cooled once again.

There are many possible variations to this cooling system. For example, the coolant can be used to cool many different electronic components 8 before returning to the convective cooling device 4, and these different electronic components 8 can be connected in series, parallel, or both. The convective cooling device 4 can be replaced with a heat exchanger that cools the coolant with another liquid, such as once through cooling water. The cooling system can use once through cooling liquid, and it is even possible for the system to be used for heating components instead of cooling them because the same heat transfer principles apply to heating as to cooling.

Electronic Substrates

Figure 2:
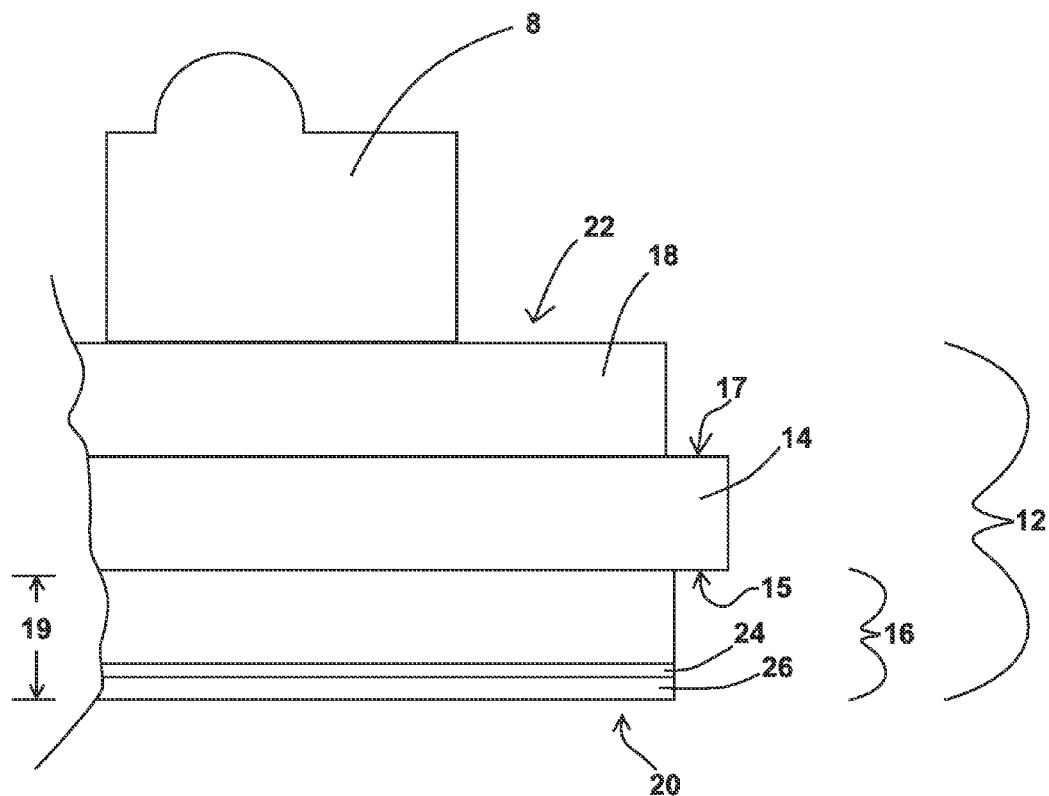
FIG. 2 depicts a side view of one embodiment of a substrate with an electronic component mounted on the substrate.

Many electronic components 8 are assembled on an electronics substrate 12, as shown in FIG. 2. The substrate 12 can provide interconnections necessary to form an electric circuit, similar to a printed circuit board. The substrate 12 can also be used to help cool the connected electronic components 8. One type of substrate 12 used is a direct bonded copper (DBC) substrate 12, where a layer of copper is directly bonded or directly plated to one or both sides of an insulating material, such as a ceramic tile 14. It may be possible to use other electrically insulating but thermally conductive materials in place of the ceramic tile 14, such as different polymers, foams, or other electrical insulators. A direct plated copper substrate 12 can also be used for electric circuits, where direct plating is an alternative method of fixing metal to a substrate 12. In this description, the term "direct bonded copper" and "DBC" are defined to include direct bonded copper and direct plated copper. Similarly, it is to be understood that references to direct bonded aluminum or other direct bonded metals also include direct plating of the metal to the substrate 12.

In some embodiments, the copper layer on one side is pre-formed or etched to form at least part of the electrical circuit, and the copper layer essentially covers the other side to help spread and transfer heat to cool the electrical components. In alternate embodiments, aluminum can be directly bonded or directly plated to a ceramic tile 14 instead of copper. It is even possible to use other metals or other materials in place of the copper or aluminum.

These directly bonded or directly plated metallic layers are referred to in this description as the cooling metal layer 16, and the electronic metal layer 18. In general, the electronic metal layer 18 can be pre-formed or etched for the electrical circuit, and the cooling metal layer 16 can be used for thermal management, but it is possible that neither metal layer 16, 18 forms part of the circuit, or both metal layers 16, 18 form part of electrical circuits. The ceramic tile 14 has an electronics face 17 opposite a cooling face 15, and the cooling metal layer 16 is directly bonded to the cooling face 15 while the electronic metal layer 18 is directly bonded to the electronic face 17.

The ceramic tile 14 can be formed from aluminum oxide ($Al_2O_3$), aluminum nitride (AlN), beryllium oxide (BeO), or other materials, and frequently has a thickness between about 0.28 millimeters (mm) and 0.61 mm, but other thicknesses are possible. The cooling and electronic metal layers 16, 18 can be a wide variety of materials, and the thickness of the metal layers 16, 18 can depend on the metal used, desired performance, and other factors. A copper layer directly bonded or directly plated to the ceramic tile 14 frequently has thicknesses ranging from 0.25 mm to 0.41 mm, but other thicknesses are possible. When an aluminum layer is directly bonded or directly plated to the ceramic tile 14, the thickness of the aluminum layer can be approximately 0.3 mm, but other thicknesses are possible. In one embodiment, the cooling metal layer 14 has a cooling metal layer thickness 19 which can be between 0.2 and 0.5 millimeters.

In some embodiments, the cooling layer outer surface 20 and/or the electronic layer outer surface 22 can have a first coating layer 24, the first coating layer 24 can have a second coating layer 26, and there can be additional coating layers as well. The cooling and electronic layer outer surfaces 20, 22 are the surfaces facing away from the ceramic tile 14. The "cooling layer outer surface 20" is defined to mean the cooling metal layer 16 outer surface before any fins or other enhancements are formed from the cooling metal layer 16, or a section of the cooling metal layer 16 which has not had any fins or enhancements formed from it. The electronic layer outer surface 22 is similarly defined, except with reference to the electronic metal layer 18 instead of the cooling metal layer 16. The first coating layer 24 can be low phosphorus electroless or electrolytic nickel, and the second coating layer 26 can be a gold layer, but other material combinations are possible. The nickel layer can be about 2 to 7 micrometers (um) thick, and the gold layer can be about 80 nanometers (nm) thick, but other thicknesses for each layer are also possible. It is also possible to directly bond a copper layer to one side of a ceramic tile 14, and an aluminum layer to the other side of the ceramic tile 14, or to use other combinations of metals for the cooling and electronic metal layer 16, 18.

The direct bonded or direct plated copper substrates 12 tend to have a relatively low coefficient of thermal expansion that is close to the coefficient of thermal expansion of silicon, due to the high bond strength of copper to the ceramic substrate 12. Many electronic components 8 contain silicon, so having a substrate 12 with a similar coefficient of thermal expansion can increase thermal cycling performance. The fact that the direct bonded or direct plated copper substrate 12 has a coefficient of thermal expansion similar to that of silicon can also reduce the need for interface layers between the substrate 12 and silicon components. The direct bonded or direct plated copper substrates 12 have many desirable characteristics known to those skilled in the art, including good heat spreading and thermal conductivity, as well as a high electrical insulation value.

Connecting the direct bonded or direct plated copper, or the direct bonded or direct plated aluminum substrates 12 to a cold plate or other coolant containing device can provide for liquid cooling. In one embodiment, heat has to transfer from the electronic component 8 to the electronic metal layer 18, then to the ceramic tile 14, then to the cooling metal layer 16, then to the wall of the cold plate, and then finally to the cooling liquid. There may also be thermal grease between the cooling metal layer 16 and the wall of the cold plate. Providing an enhanced surface on the cooling metal layer 16, and moving coolant directly past the enhanced cooling metal layer 16 would reduce the resistance to heat transfer created by the interface between the substrate 12 and the cold plate, and also the resistance to heat transfer through the barrier wall of the cold plate.

Heat Exchange Device on Electronic Substrates

Figure 3:
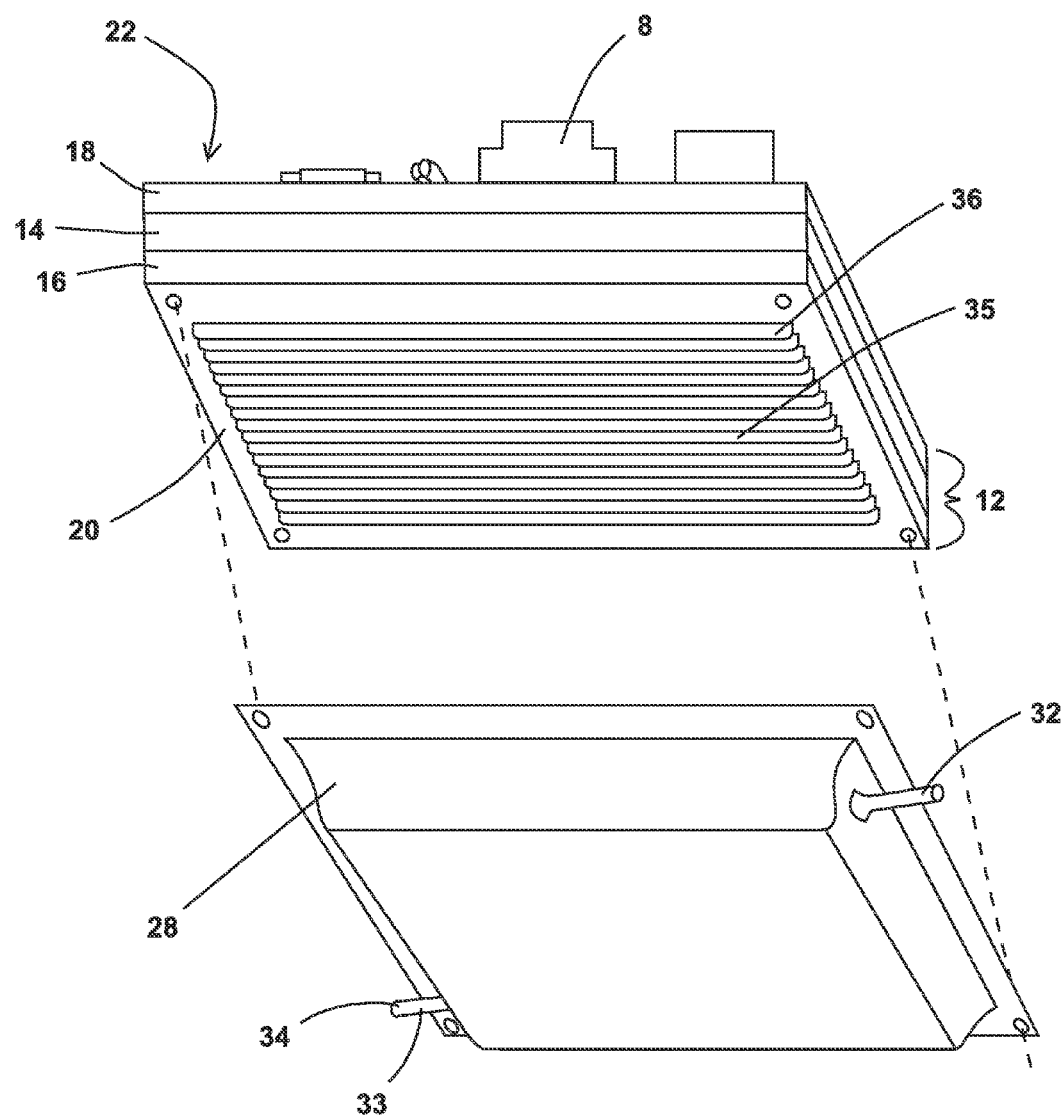
FIG. 3 is an exploded, perspective view of one embodiment of a substrate with mounted electronic components and a heat exchange device.
Figure 4:
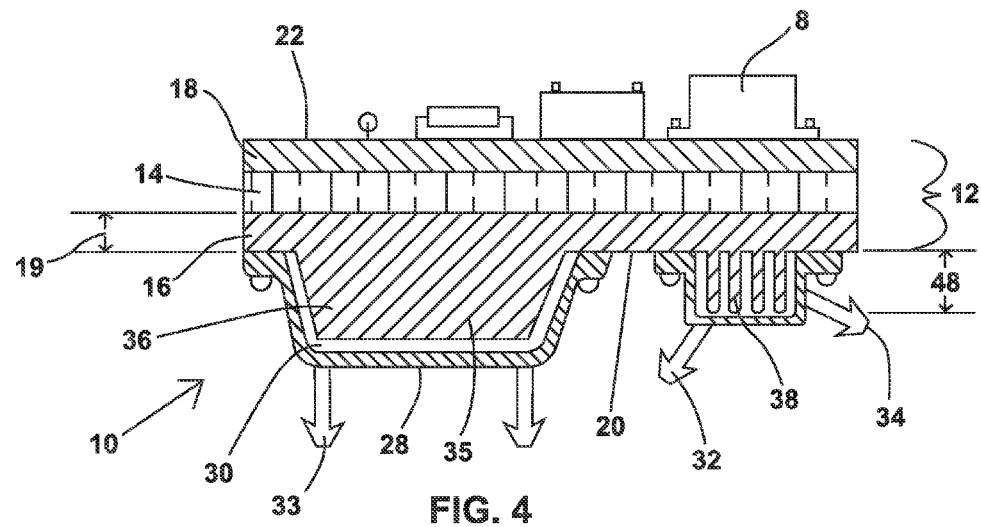
FIG. 4 is a cross-sectional side view of one embodiment of a substrate with mounted electronic components and heat exchange devices.

A heat exchange device 10 can be affixed to the substrate 12 for thermal management, as seen in FIGS. 3 and 4 with continuing reference to FIGS. 1 and 2. The heat exchange device 10 can comprise a tub 28 that is affixed to the substrate 12 to create a chamber 30 adjacent to the substrate 12. Alternatively, the chamber 30 can be made with a spacer and a cover, or many other structures which provide an enclosed space adjacent to the substrate 12. An inlet 32 and an outlet 34 are provided, where the inlet 32 and outlet 34 penetrate the chamber 30 to allow liquid to flow into and out of the chamber 30, so the inlet 32 and outlet 34 are in fluid communication through the chamber 30. The inlet 32 and outlet 34 can penetrate the tub 28, but it is also possible for one or more of the inlet 32 and outlet 34 to penetrate the substrate 12 to provide access to the chamber 30, or to penetrate any other structure used to make the chamber 30. There can be more than one inlet 32 and outlet 34, as desired, and a nozzle 33 can be used at the inlet 32 and/or outlet 34 to facilitate connections to fluid handling systems or to direct fluid flow in the chamber 30.

The tub 28 can be affixed to the cooling metal layer 16 such that the cooling metal layer 16 forms a part of the chamber 30, so fluid flowing through the chamber 30 would contact and pass directly over the cooling metal layer 16. The cooling metal layer 16 can be machined to form an enhanced surface 35, where the enhanced surface 35 comprises fins 36, but it is also possible for the enhanced surface 35 to comprise pins 38 or other structures, as desired. In general, the tub 28 is connected to the cooling metal layer 16 such that the enhanced surface 35 is positioned within the chamber 30, so coolant will contact and flow directly past the enhanced surface 35. In some embodiments, no enhancements are made to selected portions of the cooling metal layer 16, so this unenhanced portion of the cooling metal layer 16 can be used to form a seal with the tub 28, which can help prevent coolant leaks. The chamber 30 maintains liquid coolant over the enhanced surface 35, but the chamber 30 also serves to contain the liquid coolant and thereby protect the electronic components 8, the electronic metal layer 18, and other components from direct contact with the liquid coolant. The chamber 30 is one portion of a liquid coolant containment system.

Enhancements primarily include fins 36 and pins 38 of various shapes and dimensions, but can also include other structures like hollow vertical circular protrusions, horizontal hollow boxes, or other shapes. Pins 38 include rectangular or round fingers extending from the cooling layer outer surface 20, but pins also include other shapes like pyramids or semi spheres. The enhancements can extend from the substrate 12 all the way to the tub 28, so the enhancements actually touch the inner surface of the tub 28, or the enhancements can extend to a distance short of the tub inner surface. Enhancements which touch the tub 28 can result in higher heat transfer rates than shorter enhancements, but they can also result in higher pressure drops which may lead to lower coolant flow rates, and lower coolant flow rates can decrease heat transfer rates. The shape and size of the enhancements can also affect the pressure drop and heat transfer rates.

Figure 5:
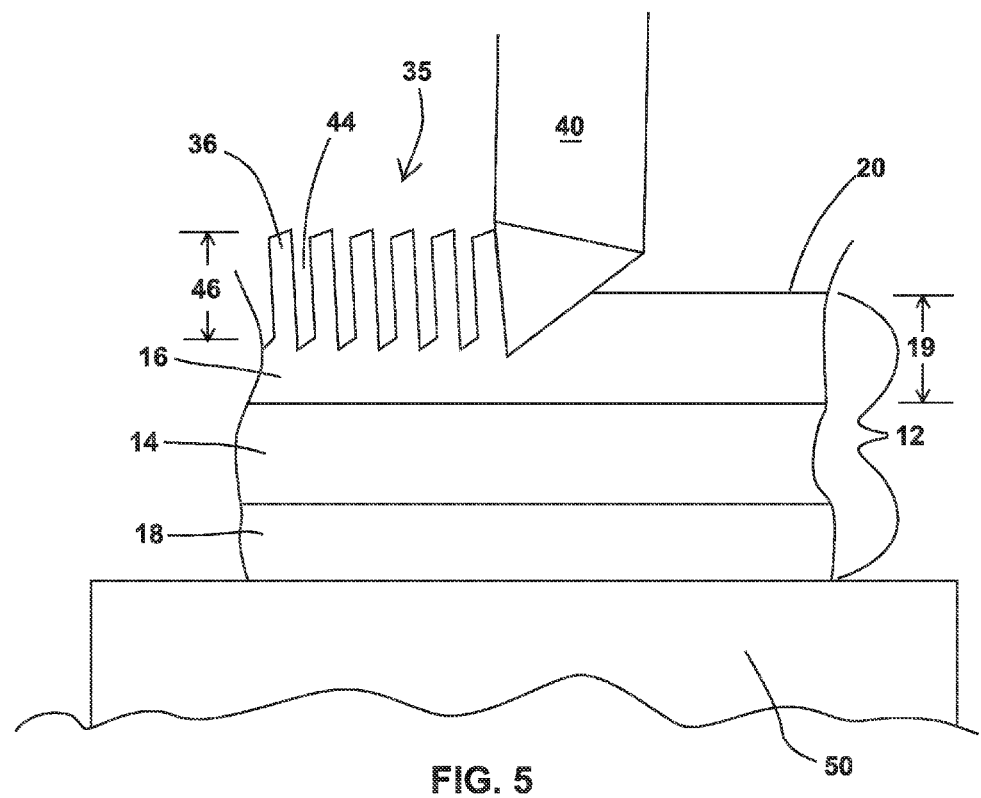
FIG. 5 is a side view of one embodiment of a tool forming fins from a substrate.
Figure 6:
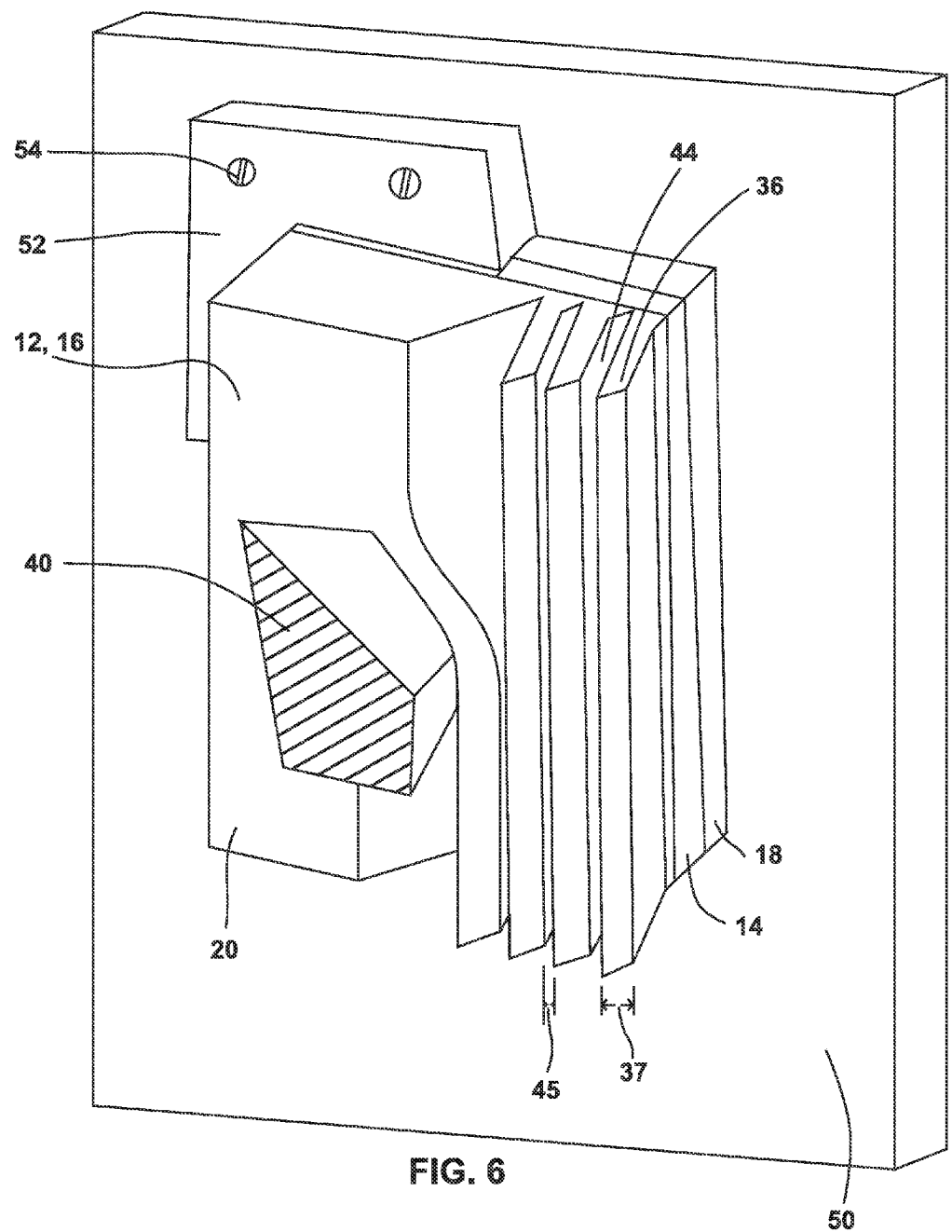
FIG. 6 is a perspective view of one embodiment of a tool forming fins from a substrate.

The fins 36 provide increased surface area for heat transfer, and also can increase turbulence in the coolant flow, both of which can increase heat transfer rates. Channels 44 are positioned between adjacent fins 36, and fluid can flow through the channels 44, as seen in FIGS. 5 and 6, with continuing reference to FIGS. 1-4. Fluid flowing through the channels 44 is in close proximity to the fins 36, and heat transfer between the fluid and the fins 36 can be rapid. Fins 36 have been used for some time to increase heat transfer, and the size, shape, and structure of the fin 36 can all impact the overall heat transfer rate. A wide variety of fin sizes, shapes and structures can be used on the cooling metal layer 16. Fin structures can include such things as platforms at the top of a fin 36, crenellated fin tops, side projections, etc. Pins 38 provide similar heat transfer improvements for similar reasons, and can also include structural modifications or enhancements.

The tub 28 or other structures forming part of the chamber 30 can be over essentially all of the cooling metal layer 16, but in other embodiments the chamber 30 will cover only a portion of the cooling metal layer 16, or there may be a plurality of different chambers 30 covering various different portions of the cooling metal layer 16. The size and spacing of the enhancements can vary between different chambers 30, and even within one chamber, as desired. There can be a plurality of enhanced surfaces 35 on one cooling metal layer 16, and each different enhanced surface 35 can comprise the same type of enhancement or different types of enhancements. The plurality of different enhanced surfaces 35 on a single cooling metal layer 16 can be discrete, separate "islands," within discrete, separate chambers 30. In alternate embodiments, the different enhanced surfaces 35 can be within the same chamber 30, where the different enhanced surfaces 35 can be connected, or the different enhanced surfaces 35 can be separated by a portion of the cooling metal layer 16 which is not enhanced. The tub 28 or other structures can be connected to the substrate 12 in a wide variety of methods, including but not limited to soldering, screws, pins, adhesive, and sonic welding. The connection between the components that form the chamber 30 should be secure to prevent coolant leaks.

Providing a chamber 30 with coolant flow directly contacting the cooling metal layer 16 at the enhanced surface 35 can improve heat transfer rates by reducing the number of interfaces and layers between an electronic component 8 and the coolant, as discussed above. Additionally, providing a thin substrate 12 with a directly connected cooling chamber 30 can reduce the space required for electronic components 8 for several reasons. First, a thin substrate 12 requires less room than a thicker substrate 12. Secondly, a cooling chamber 30 directly connected to the substrate 12 can reduce the total amount of material between the electronic component 8 and the coolant, and less material takes up less space. Thirdly, the use of liquid coolant can provide increased cooling over convective cooling with air flow, so electronic components 8 may be positioned closer together while still maintaining thermal control.

Surface Enhancements

The substrate 12 includes a ceramic tile 14 and a cooling metal layer 16, and machining can be used to enhance the cooling metal layer 16 to form an enhanced surface 35. The ceramic tile 14 is a brittle material, so any machining done to the substrate 12 should prevent flexing or bending of the substrate 12, and should also control other stresses that can fracture or break the ceramic tile 14. Generally, when one side of the substrate 12 is being machined, the entire opposite side should be firmly supported so all forces applied can be transferred straight through the substrate 12 directly to the supporting surface. While machining, the substrate 12 should be secured to prevent slipping or other motion. In one embodiment, the substrate 12 is flat, so the supporting surface should also be flat for machining. Additionally, the machining operation should be very precise, because all the various components of the substrate 12 can be thin, so there is little margin for error.

The substrate 12 can be secured to a machining base 50 by several techniques known to those skilled in the art. Some techniques for securing the substrate to the machining base 50 include securing a stop block 52 to the machining base 50, and abutting the substrate 12 against the stop block 52 such that the stop block 52 prevents the substrate 12 from slipping as the tool 40 passes through the cooling metal layer 16. Screws 54 can secure the stop block 52 to the machining base 50, but clamps, bolts, welding, or many other techniques can also be used. The substrate 12 can be further secured to the machining base 50 with clamps, but vacuum applied to the substrate surface contacting the machining base 50 can secure the substrate 12 in place without obstructing the substrate surface being machined.

The current invention includes a method of enhancing the cooling layer outer surface 20, and also a method for enhancing the electronic layer outer surface 22 if desired. The electronic layer outer surface 22 can be enhanced in the same manner as the cooling layer outer surface 20, so this description will only describe enhancing the cooling layer outer surface 20 with the understanding that the electronic layer outer surface 22 could be enhanced in the same manner.

Fins 36 can be formed on the cooling metal layer 16 using a process called micro deformation technology (MDT), which is described in U.S. Pat. No. 5,775,187, issued Jul. 7, 1998, and which is hereby incorporated in full into this description. In this process, the cooling metal layer 16 is sliced with a tool 40 without removing material from the cooling metal layer 16. The MDT) process is different than a saw or router, which removes material as cuts are made, and is more similar to the cutting of meat with a knife.

The slicing of the cooling metal layer 16 is done with the tool 40. As the tool 40 contacts the material of the cooling metal layer 16, a fin 36 is cut into the cooling metal layer 16. The slicing of the fins 36 from the cooling metal layer 16 results in the fins 36 being monolithic with the cooling metal layer 16, which improves heat transfer as discussed above. The fins 36 are formed directly from the material of the cooling metal layer 16, so there is no joint or break between the fin 36 and the cooling metal layer 16.

The fins 36 are one embodiment of an enhanced surface 35. The cutting of the cooling metal layer 16 forms a channel 44 between adjacent fins 36, and can be done without removing material from the cooling metal layer 16. Preferably, there are no shavings produced in the formation of the fins 36. The tool 40 cuts fins 36 into the cooling metal layer 16, and the space produced as the tool 40 passes through the cooling metal layer 16 forces material in the fins 36 upwards. This cutting and deformation of the cooling metal layer 16 causes the fins 36 to rise to a fin height 46 which is higher than the original cooling layer outer surface 20. The cutting tool design, the depth of the cut, and the width of the fins 36 and channels 44 are factors which affect the fin height 46. The tool 40 is moved slightly in one direction for each successive cut, so each cut forms a fin 36 adjacent to the previously cut fin 36. This process is repeated until a bed of fins 36 has been produced.

Pins 38 are made by slicing across the fins 36 with a second series of cuts. The second set of slices can also use the MDT method, and raise the pins 38 to a pin height 48 greater than the fin height 46. As the slices are made, no material is removed from the cooling metal layer 16, so the moved material is instead directed into the remaining pin 38. This causes the remaining pin 38 to rise to a height higher than the material from which the pin 38 was cut. The second set of slices can be made at a wide variety of angles to the fins 36, including ninety degrees or an angle other than ninety degrees. Additionally, the incline angle of the pin 38 and/or the fin 36 can be manipulated by the angle of the tool 40 as the slices are made. A modification of the incline angle of the fin 36 can change the incline angle of the pin 38.

In an alternate embodiment, the fins 36 are made without using the MDT process, and the pins 38 are then formed from the fins 36 using the MDT process. In another alternate embodiment, the fins 36 are made using the MDT process, and the pins 38 are then formed from the fins 36 using a conventional cutting process different than the MDT process.

The fins 36 are cut at a specified fin width 37, with a specified channel width 45, so there are a predetermined number of fins 36 per centimeter. Similar specific dimensions can be set for pins 38. Many dimensions of the enhanced surface 35 can be controlled by specifying the tool design and settings for the machining operation used. The production of the tub 28 or comparable structures can be accomplished by traditional methods. This includes stamping, cutting, pouring, molding, machining and other standard metal working techniques.

The MDT cutting process can be performed on a CNC milling machine, a lathe, a shaper, or other machining tools. The cutting depth should not be so deep that the integrity of the ceramic tile 14 is compromised, and the cutting depth should be deep enough to produce a fin height 46 sufficient to achieve the desired heat transfer rate. Experience has shown a cutting depth of about 60 to 70 percent of the cooling metal layer thickness 19 can be used. In general, the tool 40 should cut into the cooling metal layer 16 to a depth less than the cooling metal layer thickness 19. Successful beds of fins 36 have been made with between about 20 to about 60 fins per centimeter (cm), but other fin densities are also possible. One example of fin dimensions on direct bonded substrates includes a cooling metal layer thickness 19, as measured before the fins 36 are cut, of 0.30 mm, and a fin height 46 of 0.53 mm, a fin width of 0.17 mm, and a channel width of 0.17 mm. As described above, the cooling layer outer surface 20 is determined either before the fins 36 are cut or at a point where no fins 36 are formed in the cooling metal layer 16. The fin height 46 is larger than the cooling metal layer thickness 19, and the fins 36 begin at a point within the cooling metal layer 16, so the fins 36 extend beyond the cooling layer outer surface 20. As described above, the pins 38 extend to a pin height 48 which is higher than the fin height 46 before the pins 38 were made. Therefore, the pins 38 extend beyond the cooling layer outer surface 20, similar to the fins 36.

In one embodiment, a lathe is used for machining blank substrates 12, where a substrate 12 is considered blank before the cooling metal layer 16 is enhanced. The lathe can have a disk-shaped face that is perpendicular to the axis of rotation, and one or more blank substrates 12 can be secured close to the outer edge of the face of a lathe. The blank substrates 12 can be set opposite each other to help balance the lathe face during rotation. The tool 40 can then be directed into the face of the lathe, essentially parallel to the axis of rotation of the lathe, for machining of the substrates 12. The tool 40 is slowly moved either towards the axis of rotation of the lathe, or away from the axis of rotation of the lathe, so the tool 40 contacts the blank substrates 12 at different positions with every rotation of the lathe. In this manner, several blank substrates 12 can be machined simultaneously on a single lathe. Machining near the edge of the face of lathe produces fins 36 which are not straight, but which have a slight curve determined by the distance of the substrate 12 from the lathe's axis of rotation. Border areas can then be machined flat for mounting a tub 28 sealed to the cooling metal layer 16, if desired.

While the invention has been described with respect to a limited number of embodiments, those skilled in the art, having the benefit of this disclosure, will appreciate that other embodiments can be devised which do not depart from the scope of the invention as disclosed here. Accordingly, the scope of the invention should be limited only by the attached claims.

What is claimed is:

1. A method of producing an electronics substrate comprising:
   directly bonding a cooling metal layer to a first side of a ceramic tile, the ceramic tile comprising a thickness of between 0.28 mm and 0.61 mm, the cooling metal layer having a thickness of between 0.25 mm and 0.41 mm, and;
   directly bonding an electronic metal layer to a second side of a ceramic tile;

securing the ceramic tile to a machining base such that the electronic metal layer is firmly supported;

slicing fins into the cooling metal layer with a tool to form an enhanced surface, where the tool slices into the cooling metal layer to a depth less than the cooling metal layer thickness, and where the slicing step forces sliced material upwards without removing material from the cooling metal layer.

2. The method of claim 1, wherein the tool slices into the cooling metal layer to a depth of less than 70 percent of the cooling metal layer thickness.

3. The method of claim 1 further comprising:

connecting a tub to the cooling metal layer such that a chamber is formed between the tub and the cooling metal layer, and where the enhanced surface is positioned in the chamber; and forming a coolant inlet and a coolant outlet that penetrate the chamber.

4. The method of claim 1 further comprising:

connecting a plurality of electronic components to the electronic metal layer.

5. The method of claim 1 where the step of cutting fins into the cooling metal layer further comprises forming the fins to a fin height extending beyond an outer surface of the cooling metal layer.

6. The method of claim 1 further comprising slicing across the fins at an angle to form pins which extend beyond an outer surface of the cooling metal layer.

7. The method of claim 6, wherein the angle is between 30 and 90 degrees.

8. The method of claim 1 where the ceramic tile consists of aluminum oxide, aluminum nitride, beryllium oxide, or any combination thereof.

* * * * *